(12) United States Patent
Matsuyama et al.

(10) Patent No.: US 7,602,829 B2
(45) Date of Patent: Oct. 13, 2009

(54) SEMICONDUCTOR LIGHT EMITTING DEVICE AND METHOD OF MANUFACTURING SAME

(75) Inventors: Takayuki Matsuyama, Kanagawa-ken (JP); Masaaki Onomura, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 294 days.

(21) Appl. No.: 11/545,756

(22) Filed: Oct. 11, 2006

(65) Prior Publication Data

US 2008/0181275 A1 Jul. 31, 2008

(30) Foreign Application Priority Data

Oct. 11, 2005 (JP) ............................. 2005-296931

(51) Int. Cl.
*H01S 5/00* (2006.01)
(52) U.S. Cl. ................................. 372/49.01; 372/43.01
(58) Field of Classification Search ............... 372/49.01
See application file for complete search history.

(56) References Cited

U.S. PATENT DOCUMENTS

| | | | | |
|---|---|---|---|---|
| 4,656,638 A | * | 4/1987 | Tihanyi et al. | 372/49.01 |
| 4,951,291 A | * | 8/1990 | Miyauchi et al. | 372/49.01 |
| 5,392,305 A | | 2/1995 | Jakobson | |
| 5,943,356 A | * | 8/1999 | Kawai | 372/49.01 |
| 5,960,021 A | * | 9/1999 | De Vrieze et al. | 372/49.01 |
| 6,078,603 A | * | 6/2000 | Weegels et al. | 372/49.01 |
| 6,590,920 B1 | * | 7/2003 | McElhinney et al. | 372/49.01 |
| 6,677,618 B1 | * | 1/2004 | Horie et al. | 257/94 |
| 6,798,805 B2 | | 9/2004 | Yamanaka | |
| 6,812,152 B2 | | 11/2004 | Lindstrom et al. | |
| 2002/0075928 A1 | * | 6/2002 | Genei et al. | 372/49 |
| 2003/0156614 A1 | | 8/2003 | Ueda et al. | |
| 2003/0210722 A1 | | 11/2003 | Arakida et al. | |
| 2004/0165635 A1 | | 8/2004 | Sugimoto et al. | |

(Continued)

FOREIGN PATENT DOCUMENTS

CN 1440098 A 9/2002

(Continued)

OTHER PUBLICATIONS

Chinese Office Action of Chinese Application No. 2006101423916 dated Dec. 21, 2007 and English thereof.

*Primary Examiner*—Minsun Harvey
*Assistant Examiner*—Phillip Nguyen
(74) *Attorney, Agent, or Firm*—Banner & Witcoff, Ltd

(57) ABSTRACT

According to an aspect of the embodiment, there is provided a semiconductor light emitting device including: a gallium nitride substrate; a multilayer film of nitride semiconductors provided on the gallium nitride substrate; a first film including a first silicon nitride layer; and a second film including a second silicon nitride layer and a laminated film provided on the second silicon nitride layer. The gallium nitride substrate and the multilayer film have a laser light emitting facet and a laser light reflecting facet. The first silicon nitride layer is provided on the laser light emitting facet. The multilayer film includes a light emitting layer, and the multilayer film has a laser light emitting facet and a laser light reflecting facet. The second silicon nitride layer is provided on the laser light reflecting facet, and the laminated film includes oxide layer and silicon nitride layer which are alternately laminated.

19 Claims, 16 Drawing Sheets

U.S. PATENT DOCUMENTS

2006/0133441 A1 * 6/2006 Arakida et al. ........... 372/49.01

FOREIGN PATENT DOCUMENTS

| | | |
|---|---|---|
| JP | 2000-216476 | 8/2000 |
| JP | 2002-100830 | 4/2002 |
| JP | 2002-237648 | 8/2002 |
| JP | 2004-6913 | 1/2004 |

* cited by examiner

US 7,602,829 B2

SEMICONDUCTOR LIGHT EMITTING DEVICE AND METHOD OF MANUFACTURING SAME

CROSS-REFERENCE TO RELATED APPLICATIONS

This application is based upon and claims the benefit of priority from the prior Japanese Patent Application No. 2005-296931, filed on Oct. 11, 2005; the entire contents of which are incorporated herein by reference.

BACKGROUND

Blue-violet semiconductor laser devices in the 400-nanometer wavelength band are used for next generation DVD (digital versatile disc) applications. Gallium nitride and other nitride semiconductors are suitable as semiconductors emitting light in this wavelength band.

There is a disclosed technology of a nitride semiconductor laser device in which dielectric reflecting films are formed on both facets of a stripe serving as an optical resonator in order to achieve high power and reliability (JP 2004-006913A). This disclosed technology is characterized in that the dielectric reflecting film is formed as a multilayer film containing two materials selected from $SiO_2$, $TiO_2$, and $ZrO_2$.

However, a reflecting film of such composition has an excessively different linear expansion coefficient relative to gallium nitride based semiconductors. This results in insufficient adhesion between the films, and the reflecting film is likely to peel off. Consequently, characteristics variation and reliability degradation may occur.

In nitride semiconductors, non-radiative recombination is likely to occur due to a deep level formed particularly in the vicinity of a facet. The non-radiative recombination decreases carriers at the facet and increases optical absorption. This causes temperature increase and bandgap shrink in the vicinity of the facet, which further increases optical absorption. This positive feedback leads to COD (Catastrophic Optical Damage), and therefore the available maximum optical power decreases.

SUMMARY

According to an aspect of the invention, there is provided a semiconductor light emitting device comprising: a gallium nitride substrate; a multilayer film of nitride semiconductors provided on the gallium nitride substrate, the multilayer film including a light emitting layer, and the gallium nitride substrate and the multilayer film having a laser light emitting facet and a laser light reflecting facet; a first film including a first silicon nitride layer, the first silicon nitride layer being provided on the laser light emitting facet; and a second film including a second silicon nitride layer and a laminated film provided on the second silicon nitride layer, the second silicon nitride layer being provided on the laser light reflecting facet, the laminated film including oxide layer and silicon nitride layer which are alternately laminated.

According to other aspect of the invention, there is provided a semiconductor light emitting device comprising: an AlGaN buffer layer; an AlGaN cladding layer of a first conductivity type provided on the AlGaN buffer layer; a light emitting layer made of nitride semiconductor selectively provided on the AlGaN cladding layer of the first conductivity type; an AlGaN cladding layer of a second conductivity type provided on the light emitting layer; a first film provided on the AlGaN cladding layer of the second conductivity type, the first film including a first silicon nitride layer provided on a side of the AlGaN cladding layer of the second conductivity type; and a second film provided under the AlGaN buffer layer, the second film including a second silicon nitride layer and a laminated film, the second silicon nitride layer being provided on a side of the AlGaN buffer layer, the laminated film including oxide layer and silicon nitride layer which are alternately laminated, a light emitted from the light emitting layer producing resonance between the first film and the second film.

According to other aspect of the invention, there is provided a method of manufacturing a semiconductor light emitting device, comprising: forming a first film including a first silicon nitride layer, the first silicon nitride layer being provided on a laser light emitting facet of a semiconductor laser device including a gallium nitride substrate and a multilayer film of nitride semiconductors provided on the gallium nitride substrate, the multilayer film including a light emitting layer; and forming a second film including a second silicon nitride layer and a laminated film, the second silicon nitride layer being provided on a laser light reflecting facet of the semiconductor laser device, the laminated film including oxide layer and silicon nitride layer which are alternately laminated.

DETAILED DESCRIPTION

Figure 1:
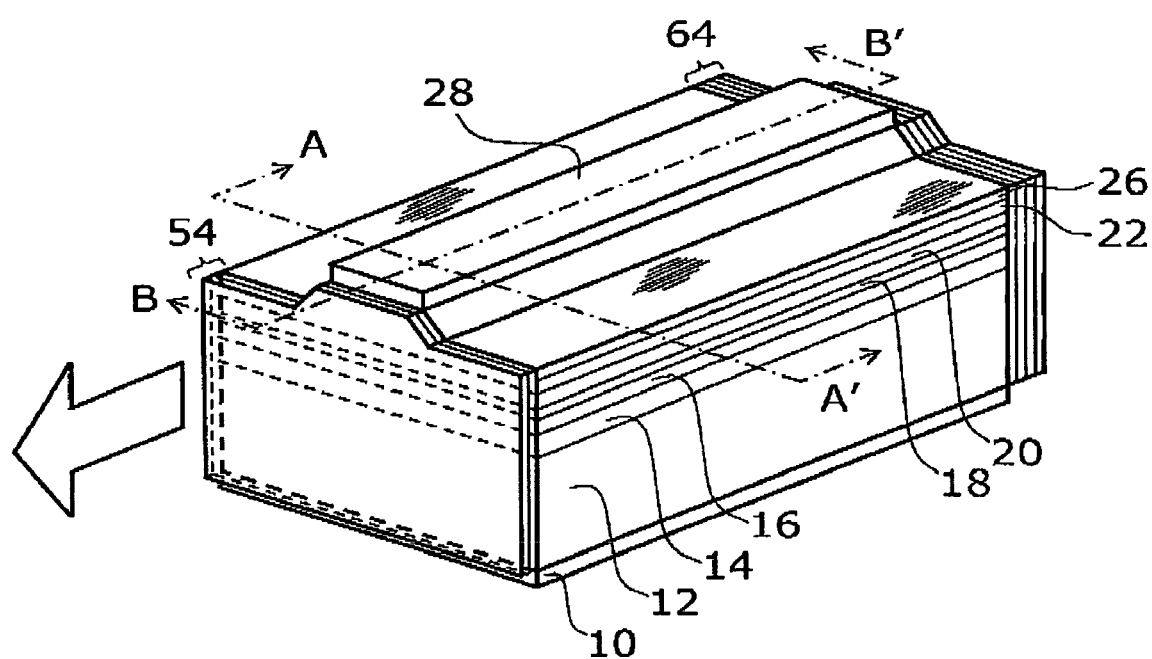
FIG. 1 is a perspective view of a nitride semiconductor laser device according to a first example.
Figure 2:
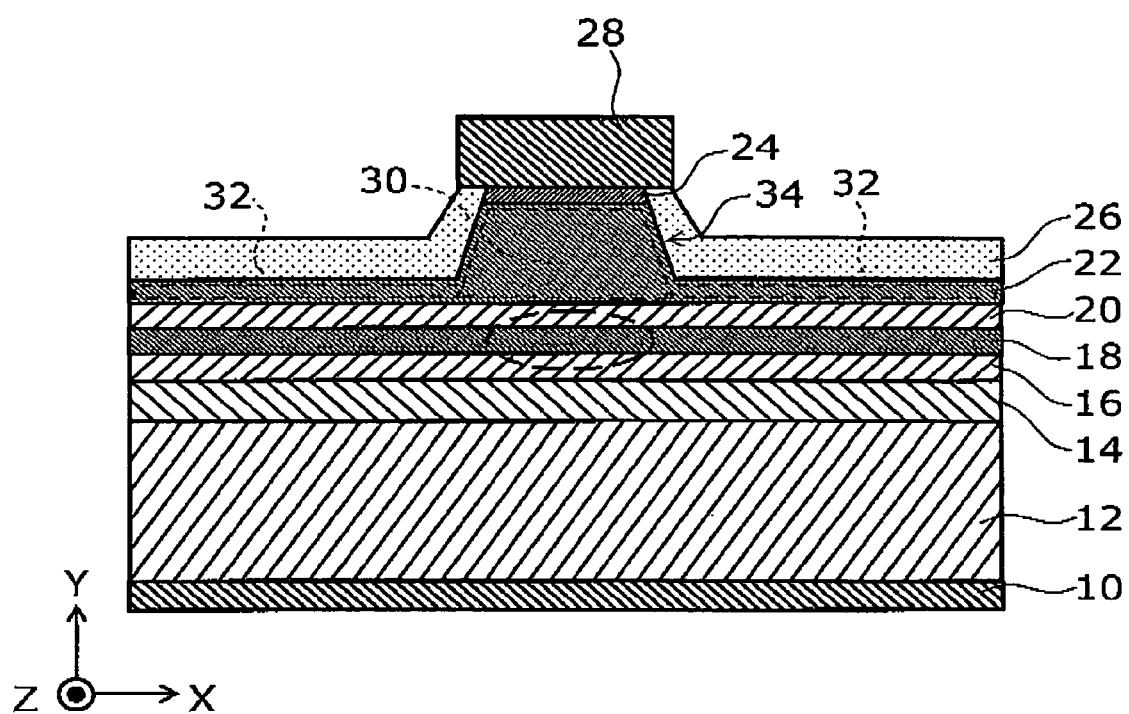
FIG. 2 is a view of a vertical cross section along the dot-dashed line AA' in FIG. 1.

Embodiments of the invention will now be described with reference to the drawings. FIG. 1 is a perspective view of a nitride semiconductor laser device according to a first example. FIG. 2 is a vertical cross section along the portion AA'.

On a GaN (gallium nitride) substrate 12, an n-type AlGaN cladding layer 14, a GaN optical guide layer 16, a quantum well structure light emitting layer 18, a GaN optical guide layer 20, a p-type AlGaN cladding layer 22, and a p$^+$-type GaN contact layer 24 are laminated in this order.

As shown in FIG. 2, the p-type AlGaN cladding layer 22 is patterned into a configuration of the so-called ridge waveguide, which is composed of a ridge portion 30 and a non-ridge portion 32. An insulating film 26 is provided on the ridge side face 34 and the upper face of the non-ridge portion 32, and serves to protect the semiconductor layers and to control higher order modes in the lateral horizontal direction. This structure is illustratively referred to as the refractive index waveguide type.

The p-type GaN contact layer 24 is provided on top of the ridge portion 30 made of the p-type AlGaN cladding layer 22 and serves to reduce contact resistance with a p-side electrode 28. An n-side electrode 10 is provided on the backside of the n-type GaN substrate 12.

In some nitride semiconductor laser devices, a multilayer film of semiconductors represented by $B_xAl_yGa_zIn_{1-x-y-z}N$ ($0 \leq x \leq 1$, $0 \leq y \leq 1$, $0 \leq z \leq 1$, $x+y+z \leq 1$) may be crystal grown on a heterogeneous substrate of sapphire or SiC (silicon carbide). However, in general, this heterogeneous substrate is very different in lattice constant from nitride semiconductors and hence involves many crystal defects. In contrast, this example is based on the GaN substrate 12 which has a small difference in lattice constant, achieving superior crystallinity. The linear expansion coefficient and the Young's modulus are also close to those of silicon nitride. However, the linear expansion coefficient of the sapphire substrate is twice or more than that of the GaN substrate. Therefore the sapphire substrate has poor adhesion to silicon nitride, and the film is likely to peel off.

Furthermore, the GaN substrate has a thermal conductivity of about 130 W/mK, which is about an order of magnitude larger than that of the sapphire substrate. Therefore this example, which is based on the GaN substrate, can increase the effect of dispersing heat generated in the vicinity of the facet where optical density is high.

Next, a description is given of a dielectric reflecting film.

As illustrated in FIGS. 1 and 2, the ridge portion 30 of the nitride semiconductor laser device has a striped configuration. The beam of the semiconductor laser device is confined in the lateral horizontal direction (X direction) below the stripe. That is, an optical resonator is formed in the Z-axis direction along this stripe. The resonance surface of this optical resonator is preferably a mirror with a small optical loss formed by cleavage or the like.

FIG. 1 illustrates the present example, which has a low reflective film (first Film) 54 composed of two layers serving as a light emitting facet and a high reflective film (second film) 64 composed of 14 films serving as a light reflecting facet.

Figure 3:
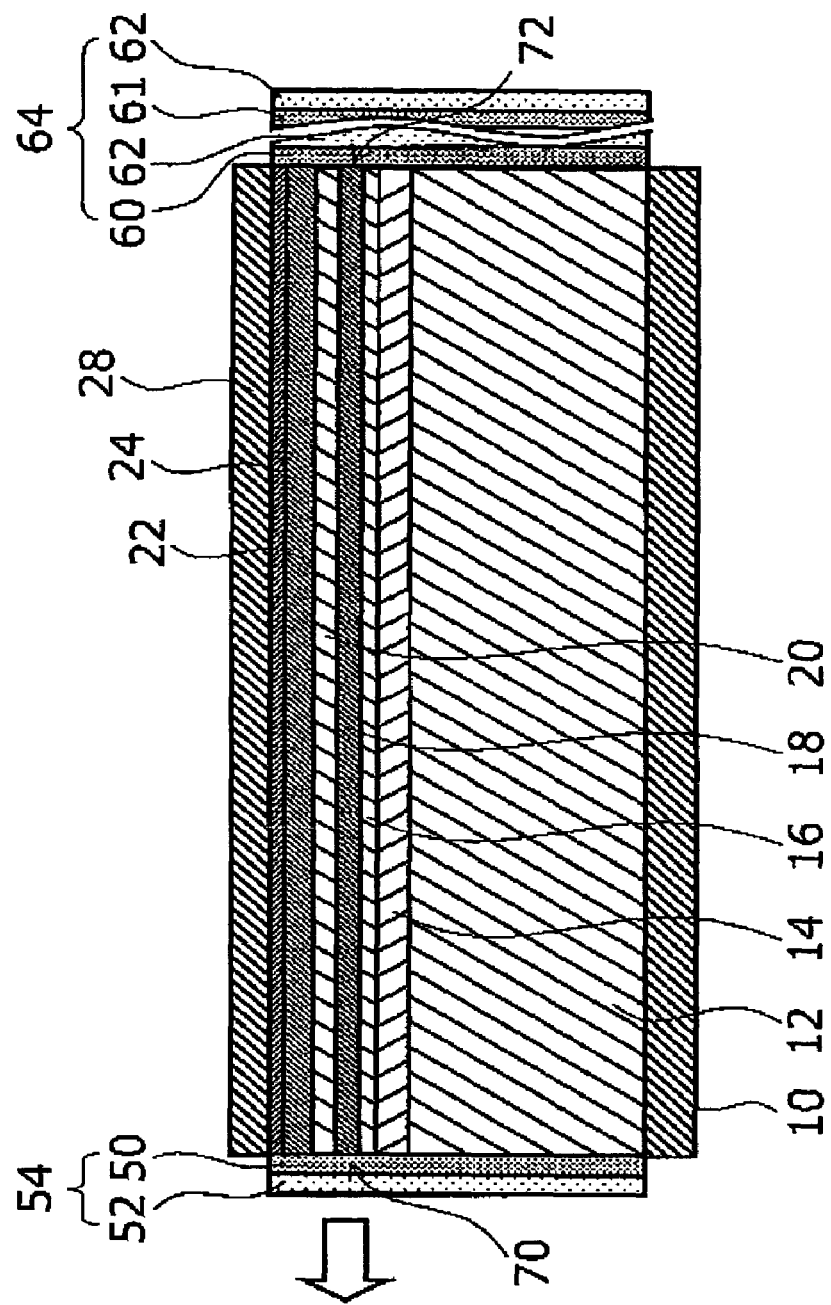
FIG. 3 is a view of a vertical cross section along the dot-dashed line BB' in FIG. 1.

FIG. 3 is a vertical cross section along BB' of the nitride semiconductor laser device illustrated in FIG. 1.

A low reflective film 54 is provided on the light emitting facet 70 of the facets constituting the optical resonator. In the low reflective film 54, a first protecting silicon nitride ($Si_3N_4$) layer 50 and a silicon oxide ($SiO_2$) layer 52 are laminated in this order, one for each layer.

A second protecting silicon nitride layer 60 is provided adjacent to the light reflecting facet 72 of the facets constituting the optical resonator. Furthermore, oxide layers 62 made of silicon oxide or the like and silicon nitride layers 61 are alternately laminated thereon to form a high reflective film 64 composed of 14 layers in total. The composition of the low reflective film is not limited to two layers. It may be made of one layer, or three or more layers.

The composition of the high reflective film is not limited to 14 layers. As the number of pairs increases, a higher reflectivity is obtained. However, the number of necessary pairs can be appropriately determined according to requirements. Note that GaN, silicon nitride, and silicon oxide have a refractive index of about 2.6, 2.0 to 2.1, and about 1.5, respectively.

In a semiconductor laser device, in order to achieve higher power, it is preferable to decrease the reflectivity of the dielectric reflecting film on the light emitting side and to increase it on the light reflecting side. Then a higher optical power can be extracted outside on the light emitting side. For example, when the optical reflectivity is 90% or more on the light reflecting side and 10% or less on the light emitting side, a higher optical power can be extracted from the light emitting side.

In this example, a silicon nitride layer is placed adjacent to each facet serving as an optical resonance surface. GaN has a linear expansion coefficient of about $3.17 \times 10^{-6}/°$ C. and a Young's modulus of $2.90 \times 10^{11}$ N/m$^2$. They are not significantly different from those of silicon nitride ($Si_3N_4$), that is, a linear expansion coefficient of about $3.20 \times 10^{-6}/°$ C. and a Young's modulus of $3.50 \times 10^{11}$ N/m$^2$. This is made clearer by comparison with GaAs. That is, GaAs has a linear expansion coefficient of about $5.90 \times 10^{-6}/°$ C. and a Young's modulus of $8.55 \times 10^{10}$ N/m$^2$, which are significantly different from those of silicon nitride.

Thus, in the case of GaAs-based semiconductors, silicon nitride is too different in linear expansion coefficient and Young's modulus. Therefore silicon nitride directly deposited on the light emitting layer has poor adhesion and may undesirably result in film peel-off. Rather, $SiO_2$ and $Al_2O_3$ are preferable.

On the other hand, in the case of GaN-based and InGaAlN-based nitride semiconductors, silicon nitride having a similar linear expansion coefficient and Young's modulus is preferable, whereas $SiO_2$, AlN, and $Al_2O_3$ are not preferable. In particular, in the present example, the light emitting layer made of nitride semiconductor is crystal grown on the GaN substrate, and hence has good adhesion to the silicon nitride layer, which is close to the GaN substrate in linear expansion coefficient and Young's modulus.

Next, another characteristic of silicon nitride is described. This relates to the maximum optical power of a semiconductor laser device. More specifically, in nitride semiconductor laser devices, deep-level non-radiative recombination centers may occur in the vicinity of the facet constituting the optical resonator. The non-radiative recombination decreases carriers in the vicinity of the facet and increases optical absorption, which also increases the temperature. Such temperature increase results in bandgap shrink, which further increases optical absorption. Because this effect forms positive feedback, the temperature increase eventually causes crystal melting. This leads to COD, and therefore the maximum optical power decreases.

However, when silicon nitride is deposited on the facet of the device composed of the GaN substrate and nitride semiconductors, the number of dangling bonds is decreased because silicon nitride also contains nitrogen (N), and thus the density of non-radiative recombination centers can be reduced. Therefore the positive feedback cycle of optical absorption and temperature increase, and hence the power reduction due to COD, can be prevented.

In this example, a silicon nitride layer, which has a linear expansion coefficient closer to that of GaN than that of heterogeneous substrates and oxide-based dielectric reflecting films, is formed on the facet of a multilayer film made of nitride semiconductors on a GaN substrate. Thus the film adhesion is improved, and the COD level is also improved. As a result, a nitride semiconductor laser device with high power characteristics and improved reliability is realized.

Next, a description is given of the structure and characteristics of the low reflective film and the high reflective film in the first example.

Figure 4:
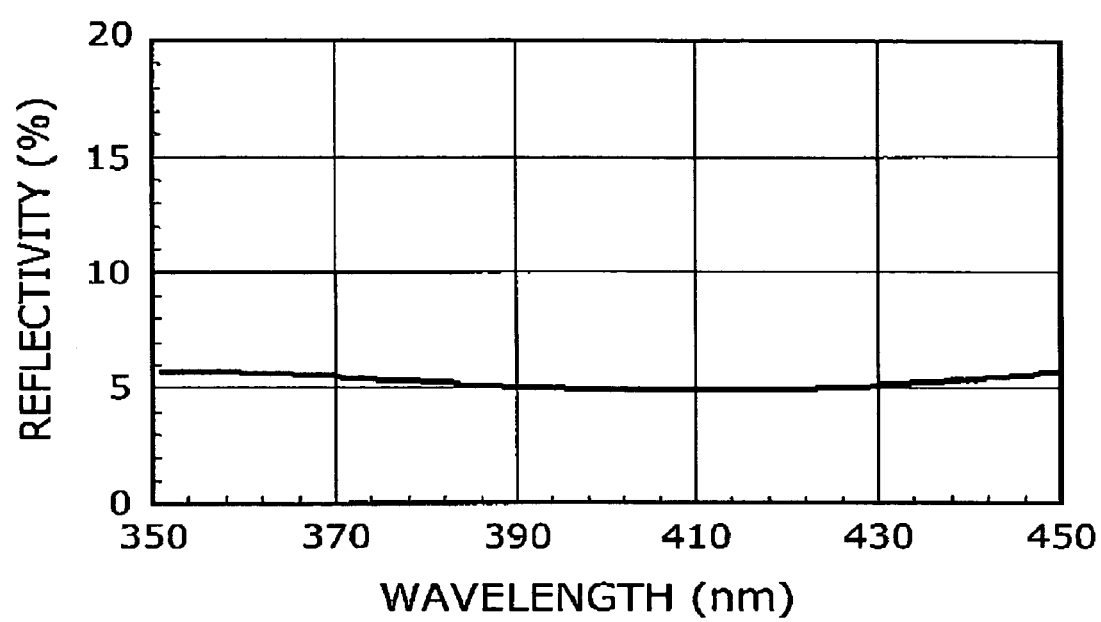
FIG. 4 is a graphical diagram of the wavelength dependence of reflectivity of the low reflective film (first film) in the first example.

FIG. 4 is a graphical diagram showing the (simulated) wavelength dependence of reflectivity at the low reflective film 54 provided on the light emitting facet.

Here, the reflectivity is designed to be 5% in the wavelength range of 400 to 410 nanometers. For example, the thickness of the first protecting silicon nitride layer 50 can be 51 nanometers, and the thickness of the oxide ($SiO_2$) layer 52 can be 153 nanometers. As a result, as illustrated in FIG. 4, a low reflectivity of about 5% is achieved in a wide wavelength range of 390 to 430 nanometers.

Figure 5:
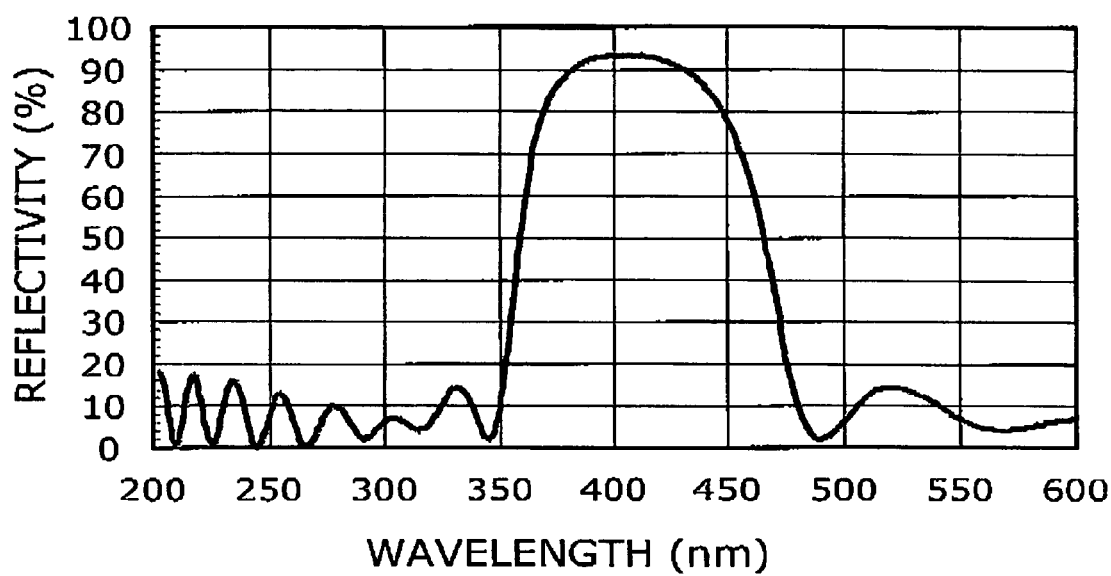
FIG. 5 is a graphical diagram of the wavelength dependence of reflectivity of the high reflective film (second film) in the first example.

FIG. 5 is a graphical diagram showing the (simulated) wavelength dependence of reflectivity at the high reflective film 64 provided on the light reflecting facet.

Here, the reflectivity is designed to be 93% in the wavelength range of 400 to 410 nanometers. The thickness of the second protecting silicon nitride layer 60 is 51 nanometers. The oxide layer 62 and the silicon nitride layer 61 have a thickness of 69 and 51 nanometers, respectively, and are alternately laminated in total of 12 layers, except that the last oxide layer has a thickness of 137 nanometers. As a result, a reflectivity of 93% or more is achieved in a wide wavelength range of 390 to 420 nanometers. This structure is a so-called Bragg reflector, where a pair of dielectrics having different refractive indices has a half-wavelength thickness and the pairs are laminated to constructively combine the reflected light.

The first protecting silicon nitride layer 50 and the second protecting silicon nitride layer 60 have a function of protecting the facet and decreasing deep levels in the vicinity of the facet of nitride semiconductors to prevent non-radiative recombination. Naturally, the first protecting silicon nitride layer and the second protecting silicon nitride layer are part of the silicon nitride layer constituting the low reflective film and the high reflective film, respectively, and also have a function of controlling the reflectivity.

In the above-described high reflective film, the thickness of the silicon nitride layer and the oxide layer can be one-quarter wavelength, respectively, but is not limited thereto. Considering that reflection occurs due to the refractive index difference between the two kinds of dielectrics, it is also possible to select the thickness of the silicon nitride layer, which has a linear expansion coefficient closer to that of GaN, to be more than one-quarter wavelength, and the thickness of the oxide layer to be less than one-quarter wavelength. Furthermore, the oxide layer is not limited to being made of $SiO_2$, but can be made of oxides such as $Al_2O_3$, $ZrO_2$, and $TiO_2$. The overall reflectivity can be calculated by simulation.

The topmost layer may be other than the oxide layer. However, the oxide layer can more effectively prevent deposition of hydrocarbons and the like in the vicinity of the light emitting layer. This is described later in detail.

Figure 6:
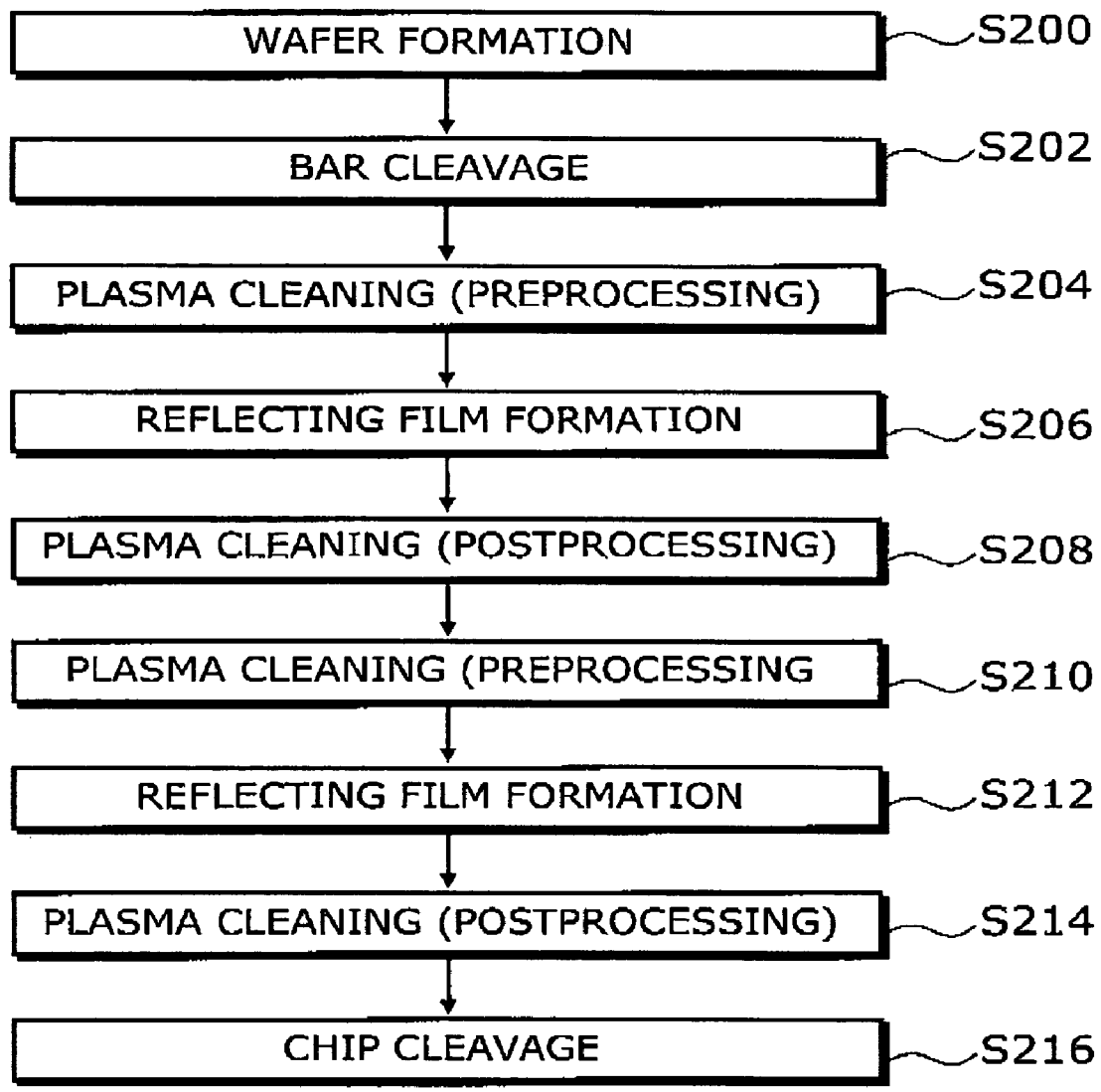
FIG. 6 is a flow diagram showing the relevant part of a process of manufacturing a nitride semiconductor laser device according to the first example.

Next, the manufacturing process of this example is described. FIG. 6 is a flow diagram showing the relevant part of the process from wafer formation to chip cleavage.

First, a wafer process is conducted for forming a nitride semiconductor multilayer film, electrodes, and the like on a GaN substrate (step S200). This wafer is cleaved by the laser scribing or other technique and separated into bars to form resonator facets (S202).

The bars are aligned on a substrate holder 80 so that their facet is opposed to the plasma. The surface of the facet to be subjected to deposition is cleaned in an ECR sputtering apparatus with argon in a plasma state at an energy of 20 to 30 eV (S204). Then, on the light emitting facet 70, a first protecting silicon nitride layer 50 with a thickness of 51 nanometers and subsequently an oxide layer 52 with a thickness of 153 nanometers are formed successively (S206). After the oxide layer is formed, it is cleaned with argon in a plasma state at an energy of 20 to 30 eV (S208). In this cleaning, contamination such as organic materials on the surface of the outermost oxide layer is removed. If the outermost oxide layer has any contamination that occurred during or after film formation by ECR, then, as described later, laser irradiation leads to charge-up and the like and is likely to deposit this contamination in the vicinity of the light emission point. However, as described above, the deposition of contamination can be prevented by cleaning with argon.

The bars are aligned on the substrate holder so that their resonance surface on the other side is opposed to the plasma. The surface is cleaned with argon in a plasma state at an energy of 20 to 30 eV (S210), and then a second protecting silicon nitride layer 60 with a thickness of 51 nanometers is formed. Furthermore, an oxide layer 62 with a thickness of 69 nanometers and a silicon nitride layer 61 with a thickness of 51 nanometers are alternately laminated in total of 12 layers, except that the last oxide layer has a thickness of 137 nanometers (S212). The total number of layers is 14. Next, cleaning is conducted with argon in a plasma state (S214). In this cleaning, contamination such as organic materials on the surface of the outermost oxide layer can be removed. Then, chip cleavage is conducted using the laser scribing or other technique (S216). While the low reflective film and the high reflective film are formed in this order in the flow diagram illustrated in FIG. 6, the order may be reversed.

Figure 7:
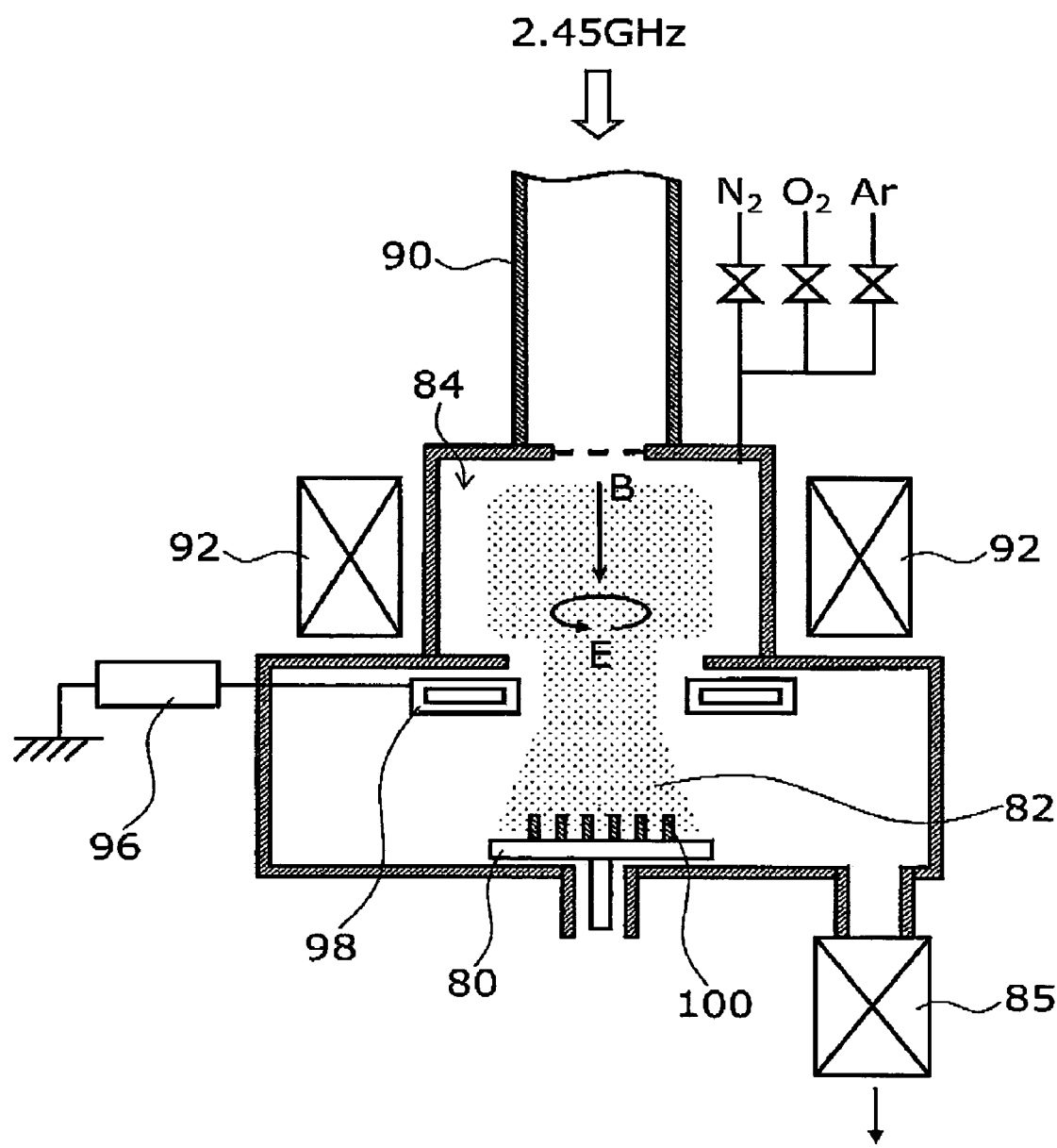
FIG. 7 is a view of the relevant part of an ECR sputtering apparatus.

FIG. 7 is a view showing an ECR (Electron Cyclotron Resonance) sputtering apparatus. This apparatus generates electric discharge with electromagnetic waves of 2.45 GHz guided by a rectangular waveguide 90. Magnetic field B applied in the resonator axis direction and rotational electric field E rotate electrons to generate a plasma 82. Thus the plasma 82 can be generated under cold cathode and high vacuum (0.01 to 0.2 Pa). The magnetic field B in the resonator axis direction is generated by a magnetic coil 92. The reaction chamber 84 is evacuated by a vacuum pump 85. Argon gas, oxygen gas, and nitrogen gas are introduced from upstream as needed. A high-purity target 98 made of silicon, metal, or the like is connected to a power supply 96.

Figure 8:
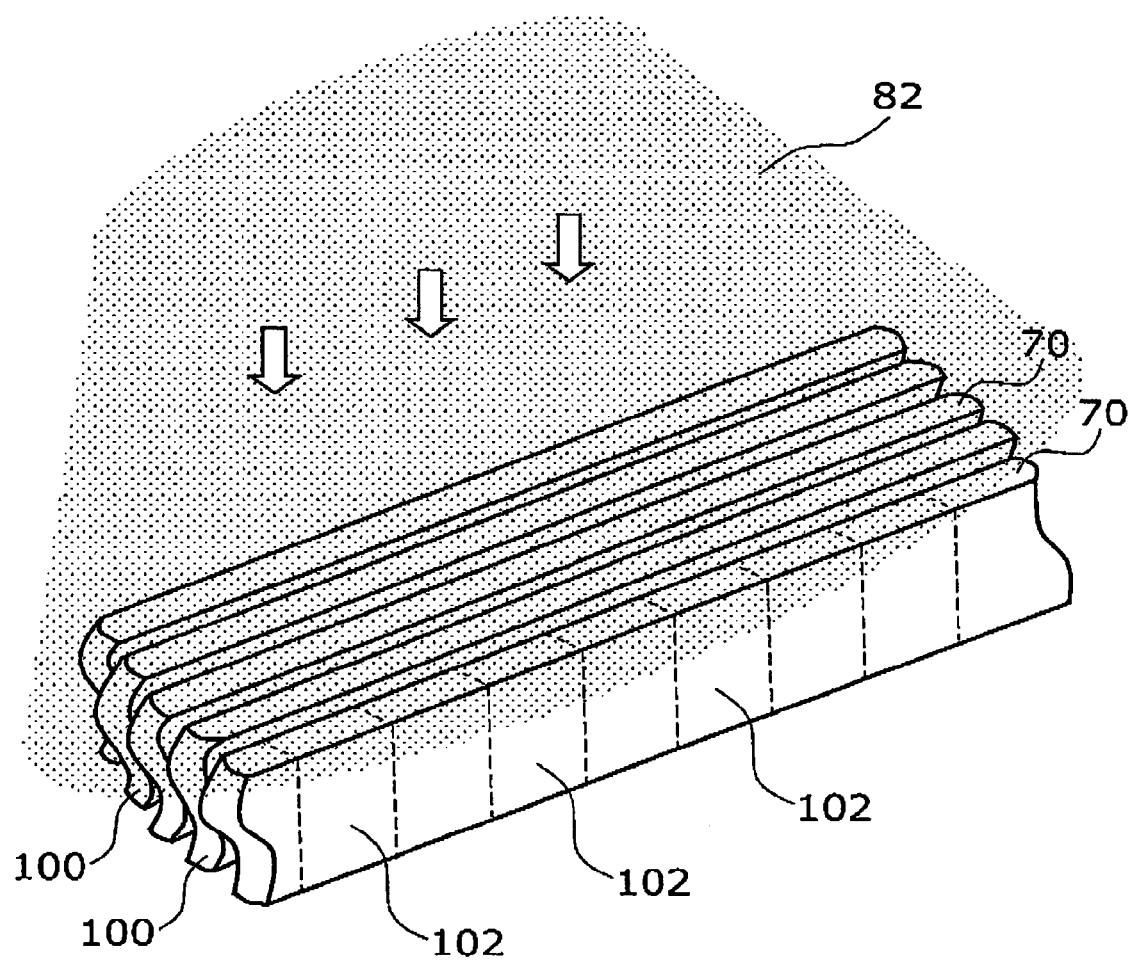
FIG. 8 is a perspective view showing how bars are arranged.

FIG. 8 is a perspective view showing how bars 100 are arranged in the ECR sputtering process. The bars 100 are arranged vertically on the substrate holder 80 so that the facet 70 is exposed to the plasma 82. A high-purity target 98 made of silicon or the like is sputtered with the plasma 82 to deposit a dielectric layer such as a silicon nitride layer or an oxide layer on the facet of the bars 100. After film growth on the opposite facet 72 (FIG. 3), the bars are scribed along the dashed lines and separated into chips 102.

Figure 9:
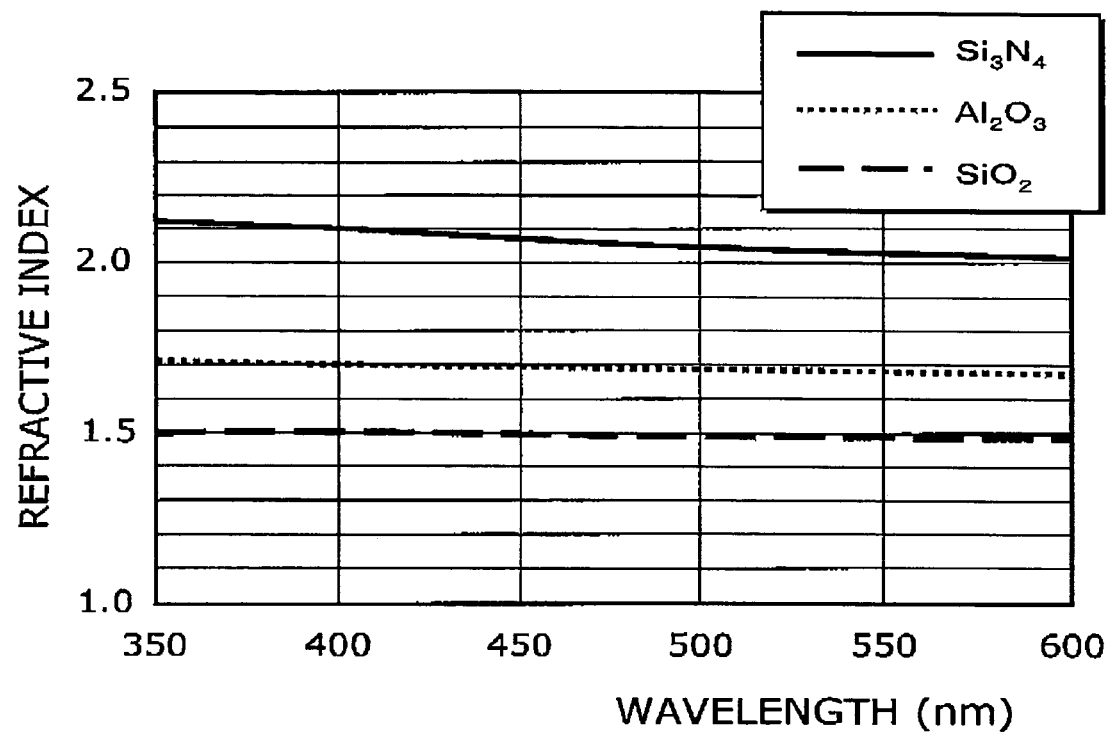
FIG. 9 is a graphical diagram of the wavelength dependence of ECR sputtered film refractive index applied to this example.

FIG. 9 is a graphical diagram showing the wavelength dependence of measured refractive index for silicon nitride ($Si_3N_4$), $Al_2O_3$, and silicon oxide ($SiO_2$) thus formed.

A high-density ECR plasma (5 to 10 mA/cm$^2$) can be generated under a low gas pressure of 0.01 to 0.2 Pa. Thus a low-damage, compact, smooth, and high-quality thin film can be formed. Dielectric reflecting films in the semiconductor laser device should have a small film thickness and a precisely controlled refractive index to prevent damage to the light emitting layer. The ECR sputtered film is suitable for such dielectric reflecting films.

For example, the ECR sputtered silicon nitride film is comparable in hardness to diamond, and hence aligns well with the GaN substrate, which is referred to as a hard crystal. Furthermore, this silicon nitride film has about 10 times higher resistance to hydrofluoric acid than a silicon nitride film based on plasma CVD, and also has a barrier property to water and hydrogen, indicating that it is a compact film.

Next, a description is given of the internal stress in the ECR sputtered film, which can be controlled by the nitrogen gas flow rate.

Figure 10:
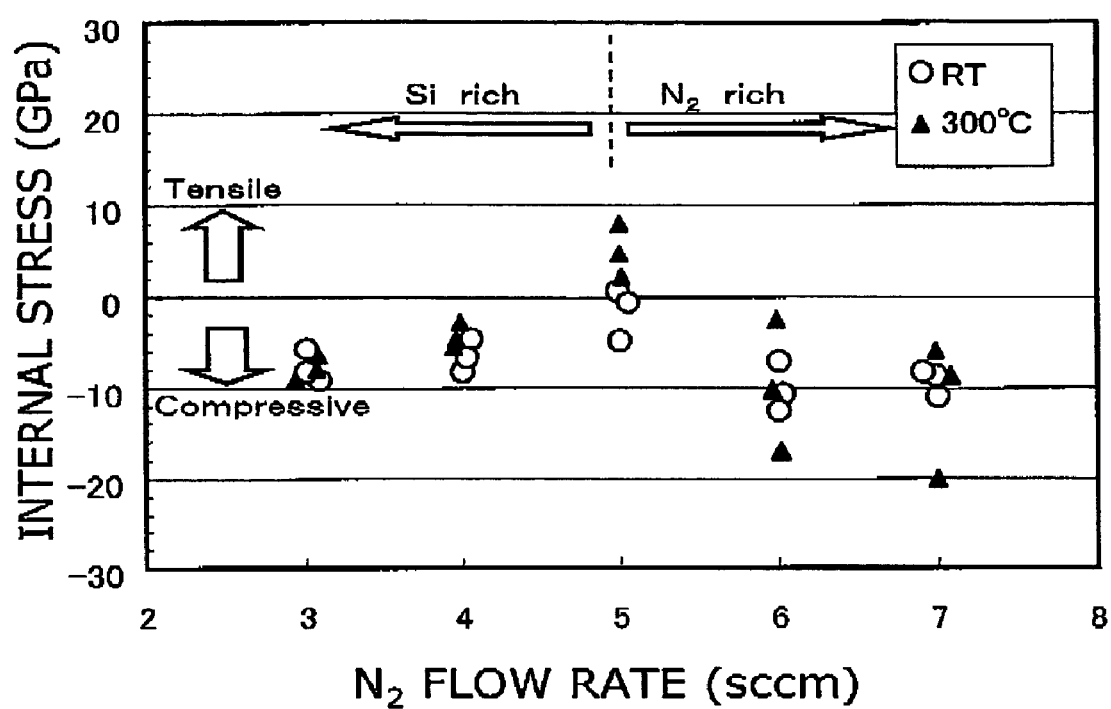
FIG. 10 is a graphical diagram of the nitrogen gas flow rate dependence of measured internal stress in an ECR sputtered film.

FIG. 10 is a graphical diagram showing the nitrogen gas flow rate dependence of the actual measurements of internal stress in an ECR sputtered film (silicon nitride) formed on the multilayer film facet of nitride semiconductors. The vertical axis represents the internal stress (GPa) of the silicon nitride film, and the horizontal axis represents the nitrogen gas flow rate (sccm). The formation temperature is a parameter, which is set to room temperature (RT) and 300° C.

At either temperature, the internal stress is maximized near a nitrogen flow rate of 5 sccm. At 300° C., for example, a film formed at a high temperature can be made tensile. On the other hand, in the region below a nitrogen flow rate of 5 sccm, the internal stress decreases as the nitrogen flow rate decreases, and is made compressive at about 4 sccm or less. The internal stress also decreases in the region above a nitrogen flow rate of 5 sccm, and is made compressive at about 6 sccm or more.

Thus the internal stress of each layer can be controlled by controlling the temperature and the nitrogen flow rate. As a result, a laminated reflecting film having a small stress distortion can be formed on nitride semiconductors.

As described above, adhesion of reflecting films to the light emitting facet 70 and the light reflecting facet 72 including a nitride semiconductor light emitting layer is improved by placing a silicon nitride layer with a similar linear expansion coefficient and Young's modulus adjacent to the facets. Furthermore, non-radiative recombination can also be prevented by reducing dangling bonds, which results in an improved COD level. Thus a nitride semiconductor laser device with improved high power characteristics and reliability is provided. For example, an average lifetime of 2,000 hours or more has been achieved at an ambient temperature of 75° C. under the operating condition of 120 mW output pulse. This sufficiently meets the requirements for the next generation DVD recording applications. In addition, the mechanical strength such as adhesion of reflecting films is improved by using the GaN substrate 12, which is made of homogeneous materials with respect to the light emitting layer, instead of sapphire and other heterogeneous substrates.

Figure 11:
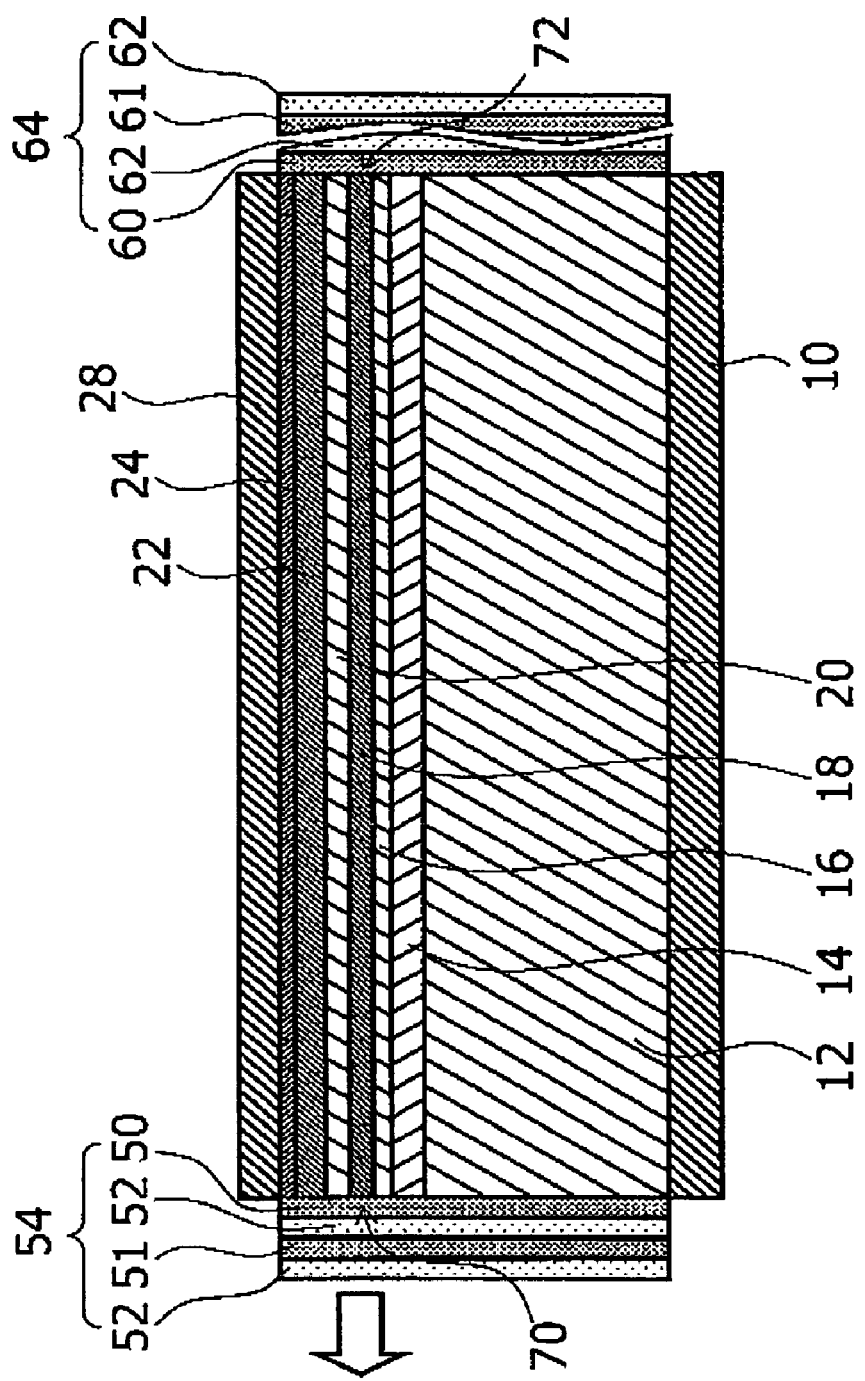
FIG. 11 is a cross section of a nitride semiconductor laser device according to a second example.

FIG. 11 is a cross section of a nitride semiconductor laser device according to a second example. With regard to this figure, elements similar to those in the first example illustrated in FIG. 3 are marked with the same reference numerals and not described in detail.

In this example, the low reflective film 54 is composed of four layers and designed to have a reflectivity of 10%. Starting from the light emitting facet 70 side, a first protecting silicon nitride layer 50, an oxide layer 52, a silicon nitride layer 51, and an oxide layer 52 are successively laminated to form the low reflective film 54.

Figure 12:
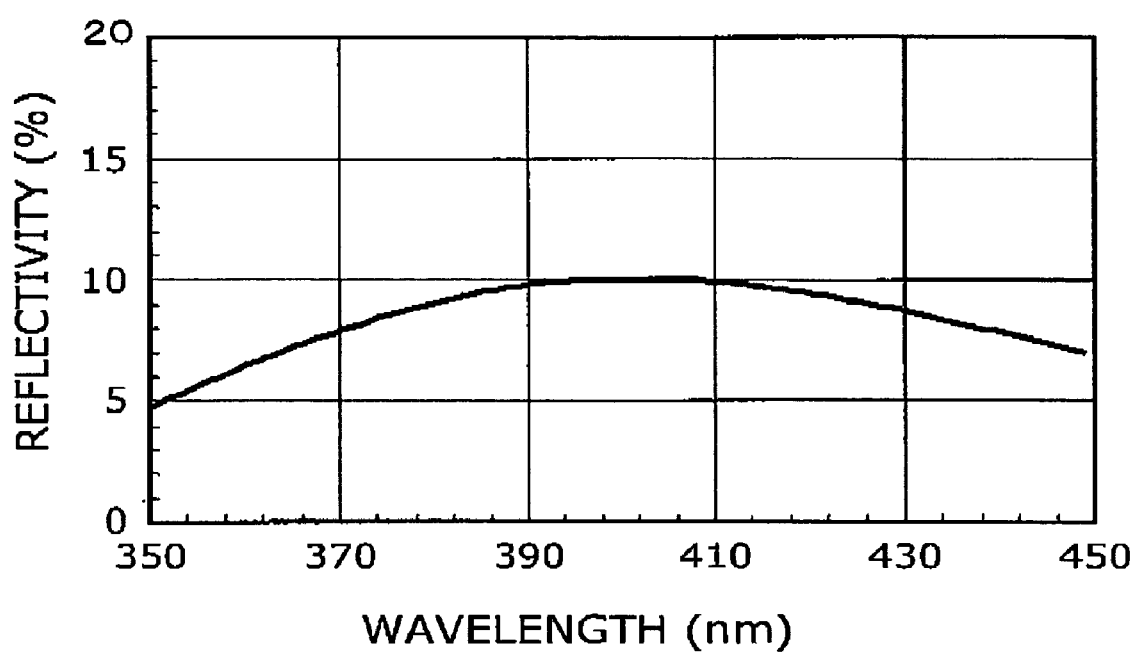
FIG. 12 is a graphical diagram of the wavelength dependence of reflectivity of the low reflective film in the second example.

FIG. 12 is a graphical diagram showing the wavelength dependence of reflectivity of the low reflective film provided on this light emitting facet.

A reflectivity of about 10% is achieved at wavelengths from 395 to 405 nanometers. The reflectivity of the low reflective film 54 increased to 10% can reduce the characteristics variation of the semiconductor laser device due to the return light from the external optics. For example, return light noise, and hence read errors for optical discs, can be reduced. Note that the high reflective film 64 provided on the light reflecting facet is the same as in the first example.

Next, contamination occurring on the dielectric reflecting film is described.

The beam from the laser device has high energy, Because of the high energy beam, deposits of hydrocarbons and the like are very rarely observed in the vicinity of the light emission point after a long time of operation.

Figure 13:
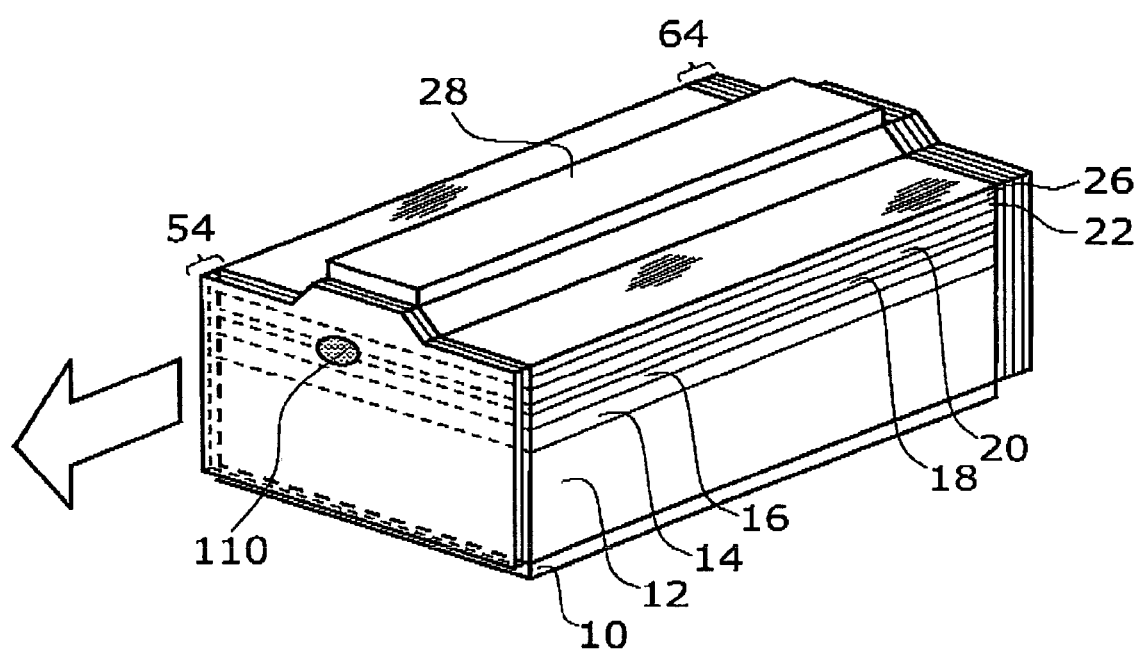
FIG. 13 is a perspective view of a comparative example.
Figure 14:
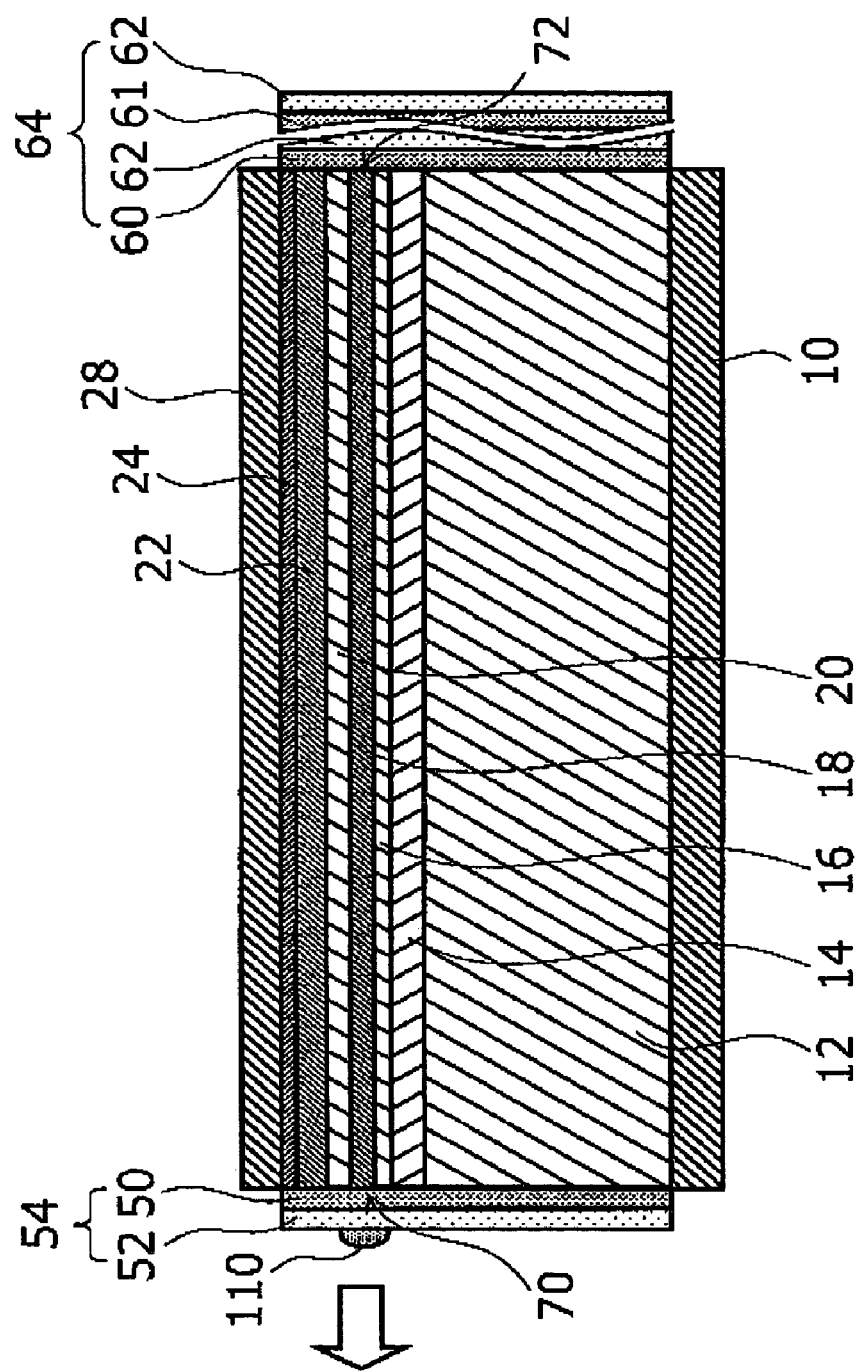
FIG. 14 is a vertical cross section of the comparative example.

FIG. 13 is a perspective view showing a comparative example on which a high-temperature accelerated test by high power operation is conducted. FIG. 14 is a cross section of the comparative example. With regard to these figures again, elements similar to those in FIGS. 1 to 12 are marked with the same reference numerals and not described in detail.

In a high-temperature accelerated test beyond the rated power operating range, charge-up by laser light may cause hydrocarbons and other organic materials to generate deposits 110 in the vicinity of the light-emission point. GaN-based materials are prone to charge-up because of their high resistivity. However, such deposits can be significantly reduced by cleaning primarily the surface of the outermost layer using an inert gas such as argon turned into a plasma state at 20 to 30 eV after the reflecting film is formed. Hydrocarbon deposition can be reduced more effectively by adding oxygen gas to the sealing atmosphere in the package.

Figure 15:
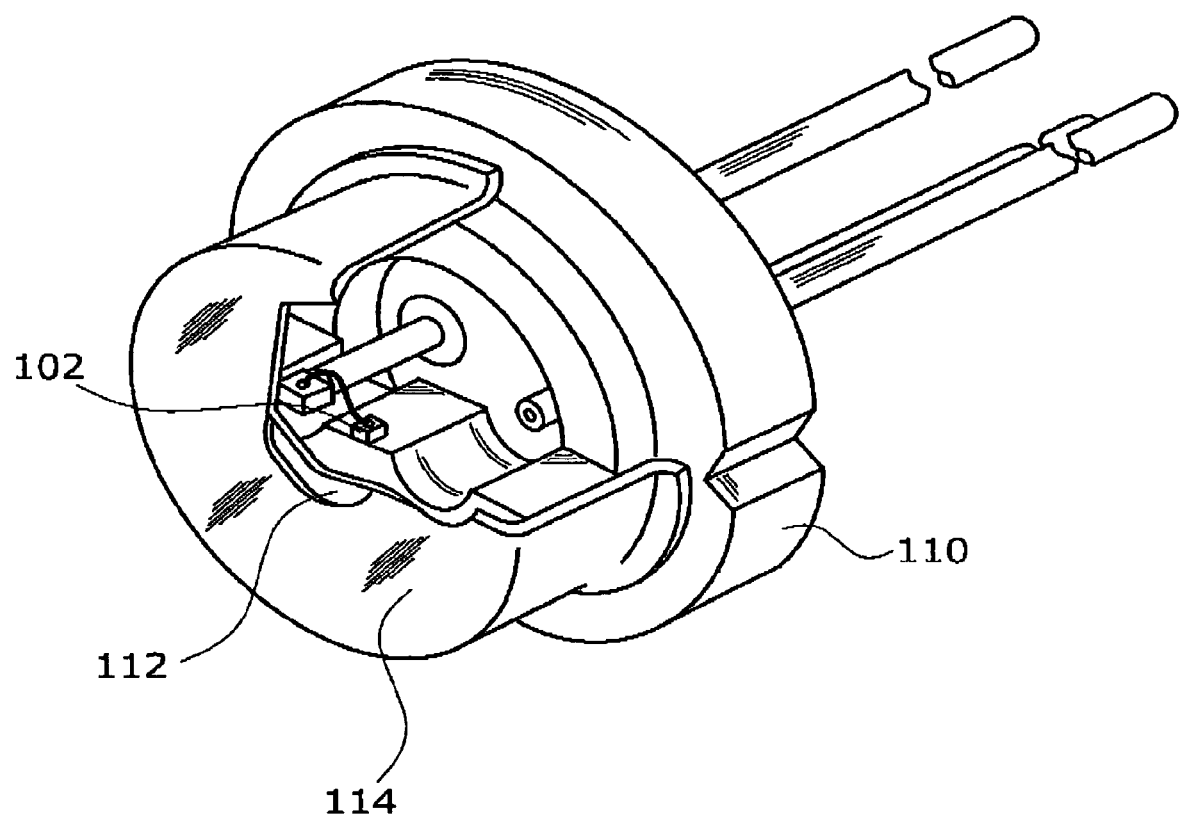
FIG. 15 is a partial cutaway perspective view of a nitride semiconductor laser device according to this example.

FIG. 15 is a partial cutaway perspective view showing a nitride semiconductor laser device incorporated into a package with a diameter of about 5.6 millimeters. A chip 102 is incorporated into a stem 110 and hermetically sealed by a cap 114 having a glass window 112. The package is filled with an oxygen-containing nitrogen gas, an inert gas, and the like.

Here, although the amount of oxygen gas is very small, it is more preferable that the outermost layer be an oxide layer for preventing oxidation of the silicon nitride layer, considering that the dielectric reflecting film is thin. That is, in the dielectric reflecting film configuration, its outermost layer is preferably an oxide layer.

Further reference is made to FIG. 15 to describe how the linear expansion distortion can be reduced during chip mounting. When a chip 102 is mounted on a stem 110 or a submount (not shown) made of AlN, SiC, or the like, the temperature is raised to 200 to 350° C. For example, in the case of mounting at 350° C., if the ECR sputtered film is formed at about 175° C., distortion due to linear expansion during mounting can be nearly halved relative to the film formed at room temperature. As a result, the mechanical strength is enhanced, and hence the reliability is improved. The formation temperature of the ECR sputtered film can be selected in the range from room temperature to the mounting temperature.

Next, a nitride semiconductor light emitting device according to a third example is described.

Figure 16:
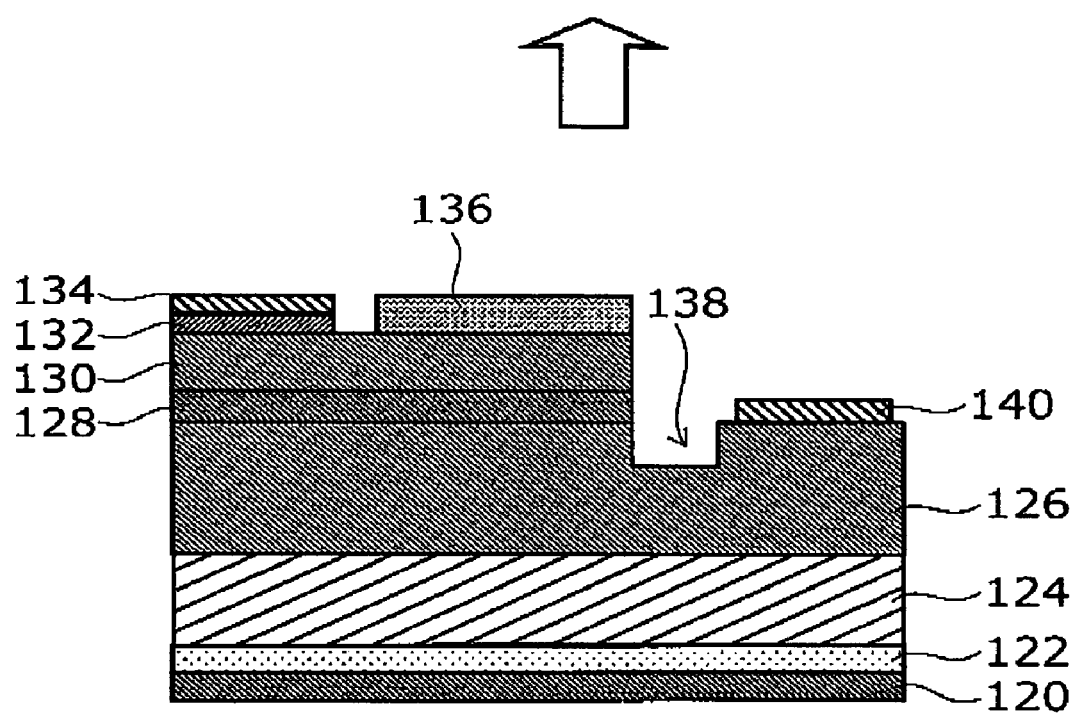
FIG. 16 is a cross section of a nitride semiconductor light emitting device according to a third example.

FIG. 16 is a cross section of a nitride semiconductor light emitting device according to the third example.

On a silicon carbide (SiC) substrate (not shown), an AlGaN buffer layer 124, an n-type AlGaN cladding layer 126, an InGaN-based light emitting layer 128, a p-type AlGaN cladding layer 130, and a p-type GaN contact layer 132 are grown. Subsequently, a separating groove 138 is formed. On the right side of the separating groove 138 in this figure, the portion above the n-type AlGaN cladding layer 126 is removed. Then the p-type GaN contact layer 132 is patterned as shown, on which a p-side electrode 134 is formed. On the other hand, beyond the separating groove 138 of the n-type AlGaN cladding layer 126, an n-side electrode 140 is formed on the exposed n-type AlGaN cladding layer 126.

Subsequently, a reflecting film 136 made of a silicon nitride layer and an oxide layer (e.g., silicon oxide layer) is formed on the p-type AlGaN cladding layer 130 outside the p-side electrode. Furthermore, the laser liftoff technique or the like is used to peel off the silicon carbide substrate, where a reflecting film 122 made of a silicon nitride layer and an oxide layer, and a Ti/Pt/Au layer 120 are successively formed on the AlGaN buffer layer 124. Thus a nitride semiconductor light emitting device is completed.

Because radiation from the InGaN-based light emitting layer 128 produces resonance in a resonator formed by the reflecting films 122 and 136, the device acts as a so-called vertical cavity surface emitting laser (VCSEL) or superluminescent LED. Here, use of only the underlying reflecting film 122 is also possible. In either case, light with high brightness resonated by the reflecting layer(s) is emitted upward from the nitride semiconductor light emitting device as illustrated by the arrow in FIG. 16.

In this example again, a silicon nitride layer is placed adjacent to the AlGaN buffer layer 124 and to the p-type AlGaN cladding layer 130. This reduces ineffective current due to non-radiative recombination, and achieves good adhesion because of the small difference in linear expansion coefficient. As a result, a vertical cavity surface emitting laser and a superluminescent LED with high power and improved reliability are provided.

Some embodiments of the invention have been described with reference to the examples.

However, the invention is not limited thereto. The shape, size, material, and positional relationship of the semiconductor multilayer film, reflecting film, package, and other elements constituting the nitride semiconductor laser device and the nitride semiconductor light emitting device, and the processes such as ECR sputtered film processing and plasma cleaning, that are adapted by those skilled in the art are also encompassed within the scope of the invention as long as they include the features of the invention.

The nitride semiconductor used herein includes semiconductors having any composition represented by the chemical formula $B_xAl_yGa_zIn_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. The nitride semiconductor may include those further containing any of various impurities added for controlling conductivity types.

The invention claimed is:

1. A semiconductor light emitting device comprising:
a gallium nitride substrate;
a multilayer film of nitride semiconductors provided on the gallium nitride substrate, the multilayer film including a light emitting layer, and the gallium nitride substrate and the multilayer film having a laser light emitting facet and a laser light reflecting facet;
a first film including at least a first silicon nitride layer, the first silicon nitride layer being provided adjacent to the laser light emitting facet; and
a second film including a second silicon nitride layer and a laminated film provided on the second silicon nitride layer, the second silicon nitride layer being provided adjacent to the laser light reflecting facet, the laminated film including at least one oxide layer and at least one silicon nitride layer which are alternately laminated.

2. A semiconductor light emitting device of claim 1, wherein the laminated film is a Bragg reflector formed from the oxide layer and the silicon nitride layer, and the silicon nitride layer constituting the Bragg reflector has a thickness of one quarter or more and less than half of a wavelength of laser light emitted from the laser light emitting facet.

3. A semiconductor light emitting device of claim 1, wherein the outermost surface of at least one of the first film and the second film is an oxide layer.

4. A semiconductor light emitting device of claim 3, wherein the outermost surface oxide layer is made of any one selected from a group comprising of $SiO_2$, $TiO_2$, $ZrO_2$ and $Al_2O_3$.

5. A semiconductor light emitting device of claim 1, wherein the oxide layers are made of any one selected from a group comprising of $SiO_2$, $TiO_2$, $ZrO_2$ and $Al_2O_3$.

6. A semiconductor light emitting device comprising:
a gallium nitride substrate;
a multilayer film of nitride semiconductors provided on the gallium nitride substrate, the multilayer film including a light emitting layer, and the gallium nitride substrate and the multilayer film having a laser light emitting facet and a laser light reflecting facet;
a first film including at least a first silicon nitride layer, the first silicon nitride layer being provided on the laser light emitting faces; and
a second film including a second silicon nitride layer and a laminated film provided on the second silicon nitride layer, the second silicon nitride layer being provided on the laser light reflecting facet, the laminated film including at least one oxide layer and at least one silicon nitride layer which are alternately laminated,
wherein the first film includes four-layers consisting of the first silicon nitride layer, an first oxide layer, a third silicon nitride layer and a second oxide layer laminated in this order from the laser light emitting facet.

7. A semiconductor light emitting device of claim 6, wherein the oxide layers included in the first film are made of any one selected from the group comprising of $SiO_2$, $TiO_2$, $ZrO_2$ and $Al_2O_3$.

8. A semiconductor light emitting device of claim 1, further comprising a hermetic package which contains the gallium nitride substrate, the multilayer film, the first film and the second film, wherein an atmosphere in the package contains oxygen gas.

9. A semiconductor light emitting device comprising:
an AlGaN buffer layer;
an AlGaN cladding layer of a first conductivity type provided on the AlGaN buffer layer;
a light emitting layer made of nitride semiconductor selectively provided on the AlGaN cladding layer of the first conductivity type;
an AlGaN cladding layer of a second conductivity type provided on the light emitting layer;
a first film provided on the AlGaN cladding layer of the second conductivity type, the first film including at least a first silicon nitride layer provided adjacent to the AlGaN cladding layer of the second conductivity type; and
a second film provided under the AlGaN buffer layer, the second film including a second silicon nitride layer and a laminated film, the second silicon nitride layer being provided adjacent to the AlGaN buffer layer, the laminated film including at least one oxide layer and at least one silicon nitride layer which are alternately laminated,
a light emitted from the light emitting layer producing resonance between the first film and the second film.

10. A semiconductor light emitting device of claim 9, wherein the laminated film is a Bragg reflector formed from the oxide layer and the silicon nitride layer, and the silicon nitride layer constituting the Bragg reflector has a thickness of one quarter or more and less than half of a wavelength of light emitted from the light emitting layer.

11. A semiconductor light emitting device of claim 9, wherein the topmost surface of the first film is an oxide layer.

12. A nitride semiconductor light emitting device of claim 11, wherein the topmost surface oxide layer is made of any one selected from a group comprising of $SiO_2$, $TiO_2$, $ZrO_2$ and $Al_2O_3$.

13. A semiconductor light emitting device of claim 9, wherein the oxide layers are made of any one selected from a group comprising of $SiO_2$, $TiO_2$, $ZrO.sub.2$ and $Al_2O_3$.

14. A semiconductor light emitting device of claim 6, wherein the laminated film is a Bragg reflector formed from the oxide layer and the silicon nitride layer, and the silicon nitride layer constituting the Bragg reflector has a thickness of one quarter or more and less than half of a wavelength of laser light emitted from the laser light emitting facet.

15. A semiconductor light emitting device of claim 6, wherein the outermost surface of at least one of the first film and the second film is an oxide layer.

16. A semiconductor light emitting device of claim 15, wherein the outermost surface oxide layer is made of any one selected from a group comprising of $SiO_2$, $TiO_2$, $ZrO_2$, and $Al_2O_3$.

17. A semiconductor light emitting device of claim 6, wherein the oxide layers are made of any one selected from a group comprising of $SiO_2$, $TiO_2$, $ZrO_2$, and $Al_2O_3$.

18. A semiconductor light emitting device of claim 6, wherein the oxide layers included in the first film are made of any one selected from the group comprising of $SiO_2$, $TiO_2$, $ZrO_2$, and $Al_2O_3$.

19. A semiconductor light emitting device of claim 6, further comprising a hermetic package which contains the gallium nitride substrate, the multilayer film, the first film and the second film, wherein an atmosphere in the package contains oxygen gas.

* * * * *

UNITED STATES PATENT AND TRADEMARK OFFICE
CERTIFICATE OF CORRECTION

PATENT NO. : 7,602,829 B2
APPLICATION NO. : 11/545756
DATED : October 13, 2009
INVENTOR(S) : Matsuyama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 296 days.

Signed and Sealed this

Fifth Day of October, 2010

David J. Kappos
*Director of the United States Patent and Trademark Office*